US006560259B1

(12) United States Patent
Hwang

(10) Patent No.: US 6,560,259 B1
(45) Date of Patent: May 6, 2003

(54) SPATIALLY COHERENT SURFACE-EMITTING, GRATING COUPLED QUANTUM CASCADE LASER WITH UNSTABLE RESONANCE CAVITY

(75) Inventor: Wen-Yen Hwang, Sugar Land, TX (US)

(73) Assignee: Applied Optoelectronics, Inc., Sugar Land, TX (US)

( * ) Notice: Subject to any disclaimer, the term of this patent is extended or adjusted under 35 U.S.C. 154(b) by 149 days.

(21) Appl. No.: 09/854,800

(22) Filed: May 14, 2001

Related U.S. Application Data

(60) Provisional application No. 60/208,112, filed on May 31, 2000.

(51) Int. Cl.[7] ................................................. H01S 3/08
(52) U.S. Cl. .......................... 372/45; 372/43; 372/102
(58) Field of Search ............................ 372/45, 102, 46, 372/43, 50; 438/31; 385/37; 359/34, 500

(56) References Cited

U.S. PATENT DOCUMENTS

| | | | |
|---|---|---|---|
| 5,457,709 A | | 10/1995 | Capasso et al. |
| 5,468,656 A | | 11/1995 | Shieh et al. |
| 5,509,025 A | | 4/1996 | Capasso et al. |
| 5,568,311 A | * | 10/1996 | Matsumoto .................. 372/46 |
| 5,727,016 A | | 3/1998 | Paxton |
| 5,760,960 A | * | 6/1998 | Lin et al. ....................... 359/34 |

(List continued on next page.)

FOREIGN PATENT DOCUMENTS

| | | | | |
|---|---|---|---|---|
| JP | 402156691 | * | 6/1988 | .................. 372/46 |

OTHER PUBLICATIONS

Luo et al., "Grating–Tuned External–Cavity Quantum–Cascade Semiconductor Lasers," *Applied Physics Letter*, vol. 78, No. 19, (2001), pp. 2834–2836.

(List continued on next page.)

*Primary Examiner*—Albert W. Paladini
(74) *Attorney, Agent, or Firm*—N. Stephan Kinsella

(57) ABSTRACT

A surface emitting, unipolar, quantum cascade semiconductor laser is constructed of a multilayer semiconductor structure on a substrate. The laser has doped semiconductor material only of one conductivity type. The laser includes a core region having a larger effective refractive index than cladding regions. The core region includes a plurality of repeat units, each repeat unit having a nominally identical active region and a carrier injection and relaxation region. The repeat units are for quantum cascade generation of a lasing resonance mode within a lasing resonance cavity of the multilayer semiconductor structure. A diffraction grating is fabricated within the multilayer semiconductor structure. The grating resonantly couples diverging counter-propagating traveling wave beams of the laser resonance mode while also diffracting light into an upward direction perpendicular to a grating plane and toward the substrate surface, and also into a downward direction. A mirror reflects the downwardly coupled light toward the upward direction again. The optical distance between reflecting mirror and the grating is selected to combine the reflected light with the upwardly coupled light in-phase as the output beam. A lens-like media structure having an effective refractive index profile that varies quadratically in a direction transverse to the laser resonance cavity is included in the multilayer semiconductor structure. The lowest value of the profile is located at a central portion of the laser. The profile monotonically increases moving away from the central portion. The lens-like media structure interacts with the counter-propagating traveling wave beams to provide single mode output.

47 Claims, 5 Drawing Sheets

U.S. PATENT DOCUMENTS

| | | | |
|---|---|---|---|
| 5,901,168 A | | 5/1999 | Baillargeon et al. |
| 5,985,686 A | | 11/1999 | Jayaraman |
| 6,023,482 A | | 2/2000 | Capasso et al. |
| 6,055,254 A | | 4/2000 | Capasso et al. |
| 6,055,257 A | | 4/2000 | Baillargeon et al. |
| 6,252,985 B1 | * | 6/2001 | Nitta et al. .................... 372/45 |
| RE37,809 E | * | 7/2002 | Deacon et al. .............. 372/102 |

OTHER PUBLICATIONS

Guel–Sandoval, S. et al., "Novel High–Power and Coherent Semiconductor Laser with a Shaped Unstable Resonator," *Applied Physics Letter*, vol. 66, No. 16, (1995), pp. 2048–2050.

Faist et al., "High Power Mid–Infrared ($\lambda$~5 $\mu$m) Quantum Cascade Lasers Operating Above Room Temperature," *Applied Physics Letter*, vol. 68, No. 26, (1996), pp. 3680–3682.

Sirtori et al., "Continuous Wave Operation of Midinfrared (7.4–8.6 $\mu$m) Quantum Cascade Lasers Up To 110 K Temperature," *Applied Physics Letter*, vol. 68, No. 13, (1996), pp. 1745–1747.

Faist et al., "Distributed Feedack Quantum Cascade Lasers," *Applied Physics Letter*, vol. 70, No. 20, (1997), pp. 2670–2672.

Noll, R. J. and Macomber, S. H., "Analysis of Grating Surface Emitting Lasers," *IEEE J. Quantum Electronics*, vol. 26, No. 3, (1990), pp. 456–466.

Macomber et al., "Curved–Grating, Surface–Emitting DFB Lasers and Arrays," *SPIE*, vol. 3001, pp. 42–53.

Lang, Robert J., "Design of Aberration–Corrected Curved–Mirror and Curved–Grating Unstable Resonator Diode Lasers," *IEEE Journal of Quantum Electronics*, vol. 30, No. 1, (1994), pp. 31–36.

Kastalsky, A., "Infrared Intraband Laser Induced in a Multiple–Quantum–Well Interband Laser," *IEEE Journal of Quantum Electronics*, vol. 29, No. 4, (1993), pp. 1112–1113.

Sirtori et al., "Mid–Infrared (8.5$\mu$m) Semiconductor Lasers Operating at Room Temperature," *IEEE Photonics Technology Letters*, vol. 9, No. 3, (1997), pp. 294–296.

Gmachl et al., "Continuous–Wave and High–Power Pulsed Operation of Index–Coupled Distributed Feedback Quantum Cascade Laser at $\lambda \approx 8.5$ $\mu$m," *Applied Physics Letters*, vol. 72, No. 12, (1998), pp. 1430–1432.

Gmachl et al., "Complex–Couupled Quantum Cascade Distributed–Feedback Laser," *IEEE Photonics Technology Letters*, vol. 9, No. 8, (1997), pp. 1090–1092.

* cited by examiner

SPATIALLY COHERENT SURFACE-EMITTING, GRATING COUPLED QUANTUM CASCADE LASER WITH UNSTABLE RESONANCE CAVITY

CROSS-REFERENCE TO RELATED APPLICATION

This application claims the benefit of U.S. provisional application No. 60/208,112, filed May 31, 2000, which is incorporated herein by reference in its entirety.

BACKGROUND OF THE INVENTION

1. Field of the Invention

This invention relates generally to sources of electromagnetic laser radiation and, in particular, to unipolar semiconductor quantum cascade (QC) lasers and fabrication thereof.

2. Description of the Related Art

The following descriptions and examples are not admitted to be prior art by virtue of their inclusion within this section.

Lasers have a wide range of industrial and scientific uses. There are several types of lasers, including gas lasers, solid-state lasers, liquid (dye) lasers, and free electron lasers. Semiconductor lasers are also in use. The possibility of amplification of electromagnetic waves in a semiconductor superlattice structure, i.e., the possibility of semiconductor diode lasers, was predicted in a seminal paper by R. F. Kazarinov, et al., "Possibility of the Amplification of Electromagnetic Waves in a Semiconductor with a Superlattice," *Soviet Physics Semiconductors*, vol. 5, No. 4, pp. 707–709 (October 1971). Semiconductor laser technology has continued to develop since this discovery.

There are a variety of types of semiconductor lasers. Semiconductor lasers may be diode lasers (bipolar) or non-diode lasers such as quantum cascade (QC) lasers (unipolar). Semiconductor lasers of various types may be electrically pumped (by a DC or AC current), or pumped in other ways, such as by optically pumping (OP) or electron beam pumping. Semiconductor lasers are used for a variety of applications and can be built with different structures and semiconductor materials, such as gallium arsenide.

Additionally, semiconductor lasers may be edge-emitting lasers or surface-emitting lasers (SELs). Edge-emitting semiconductor lasers output their radiation parallel to the wafer surface, while in SELs, the radiation is output perpendicular to the wafer surface. One type of SEL is the vertical cavity surface emitting laser (VCSEL). The VCSEL structure usually consists of an active (gain) region sandwiched between two distributed Bragg reflector (DBR, or mirror stack) mirrors. The DBR mirrors of a typical VCSEL can be constructed from dielectric or semiconductor layers (or a combination of both, including metal mirror sections). Other types of VCSELs sandwich the active region between metal mirrors. The area between the reflective planes is often referred to as the resonator, or resonance cavity.

Semiconductor diode lasers are attractive as sources of optical energy in industrial and scientific applications. For example, semiconductor diode lasers have a relatively small volume and consume a small amount of power as compared to conventional laser devices. Also, semiconductor diode lasers are monolithic devices that do not require combining a resonance cavity with external mirrors and other structures to generate a coherent output laser beam. Further, the continuous development of semiconductor lasers in the last two decades has significantly improved their maximum output power to the kilowatt range, spanning wavelengths of more than 10 $\mu$m. Semiconductor lasers are now widely used in industrial processing, telecommunications, data storage, and the like. Despite these improvements, however, semiconductor diode lasers still have a relatively low power output, as compared to other, conventional types of laser devices.

Semiconductor diode lasers, including quantum well lasers, are bipolar semiconductor laser devices. A diode laser typically has n-type layers on one side, and p-type layers on the other side, of an undoped active or core region. Such bipolar laser devices rely on transitions between energy bands in which conduction band electrons and valence band holes, injected into the active region through a forward-biased p-n junction, radiatively recombine across the bandgap. Thus, in diode lasers, the bandgap of the available active region materials essentially determines, and limits, the lasing wavelength. For example, the longer the laser wavelength needed, the smaller the required material bandgap, and vice versa. Unfortunately, the characteristics of small bandgap materials can make it difficult, expensive, or impractical to obtain lasing operation at certain desired wavelengths, such as mid-infrared (mid-IR or MIR) wavelengths.

Semiconductor lasers are typically powered by applying an electrical potential difference across the active region, which causes a current to flow therein. Electrons in the active region attain high energy states as a result of the potential applied. When the electrons spontaneously drop in energy state, photons are produced. Some of those photons travel in a direction perpendicular to the reflective planes of the laser. As a result of the ensuing reflections, the photons can travel through the active region multiple times. When those photons interact with other high energy state electrons, stimulated emission can occur so that two photons with identical characteristics are present. If most electrons encountered by the photons are in the high energy state, the number of photons traveling between the reflective planes tends to increase. A typical laser includes a small difference in reflectivity between its mirrors. The primary laser output is emitted through the reflective plane having lower reflectivity.

The aforementioned QC was initially described in U.S. Pat. No. 5,457,709, which is incorporated herein by reference in its entirety. See also U.S. Pat. Nos. 5,509,025, 5,901,168, and U.S. Pat. No. 6,055,257, which are incorporated herein by reference in their entireties. Unlike diode lasers, QC lasers are unipolar, that is, they are based on one type of carrier (typically electrons in the conduction band), which make inter-subband transitions between energy levels created by quantum confinement. In a unipolar semiconductor laser, electronic transitions between conduction band states arise from size quantization in the active region heterostructure. The inter-subband transitions are between excited states of coupled quantum wells for which resonant tunneling is the pumping mechanism.

A single active region unipolar semiconductor laser is possible, but multiple active regions may be used as well. QC lasers, for example, typically comprise an active region having a plurality (e.g., 25) of essentially identical undoped active regions, sometimes referred to as radiative transition (RT) regions. Each active (RT) region comprises a plurality of semiconductor layers, and has quantum well regions interleaved with barrier regions, to provide two or more coupled quantum wells. These coupled quantum wells have at least second and third associated energy states for the charge carriers (e.g. electrons). The second energy state is of lower energy than the third energy state, which correspond to second and third wavefunctions, respectively. The energy difference between the third and the second energy states determines the laser emission wavelength. The energy difference between second and third energy states is in turn determined by the arrangement of all the coupled quantum wells in the active region. The arrangement includes the number of quantum wells, the thickness of each individual quantum well, and the energy height and thickness of each energy barrier layer between two neighboring quantum wells.

A multilayer carrier injector or injection region, sometimes referred to as an "injection/relaxation" (I/R) or "energy relaxation" region, is disposed between any two adjacent active regions. Thus, a given active region is separated from an adjoining one by an I/R region. The I/R region, like the active region, also typically comprises a plurality of semiconductor layers. Each active region-I/R region pair (i.e., each RT-I/R pair) may also be referred to as a "repeat unit." At least some of the layers in each I/R region are doped, and in any case, the I/R regions as well as the active regions are unipolar. The aforementioned U.S. Pat. No. 5,457,709 discloses a technique for designing a QC laser that uses the inter-subband transition between energy levels of a coupled quantum well structure and an I/R region with a digitally graded energy gap structure, and the nominal structure of a QC laser is described in the aforementioned U.S. Pat. No. 5,509,025. Unlike a diode laser, the layers of the multilayer semiconductor QC laser structure are either undoped, or, if doped, they are of the same type, e.g. n-type.

An operating voltage is provided across the multilayer semiconductor structure. This causes substantial energy relaxation of charge carriers (e.g. electrons) in the I/R regions, some of which are introduced into the I/R region from an adjacent active region. These carriers undergo a radiative transition, leading to lasing. QC lasers and various improvements to QC lasers since their initial description in the aforementioned U.S. Pat. No. 5,457,709 are discussed in Faist, J. et al., "High Power Mid-infrared ($\lambda_0$ about 5 $\mu$m) Quantum Cascade Lasers Operating Above Room Temperature," *Appl. Phys. Lett.*, vol. 68, pp. 3680–3682 (1996) and Sirtori, C. et al., *Appl. Phys. Lett.*, vol. 68, p. 1745 (1996).

For several types of applications, especially in the area of optical sensors for atmospheric trace gases, it is advantageous to operate with single mode, single frequency lasers. The use of distributed feedback (DFB) QC lasers for this purpose has been extensively explored, as described in Faist, J. et al., "Distributed Feedback Quantum Cascade Lasers", *Appl. Phys. Lett.*, vol. 70, No. 20, pp. 2670–2672 (1997); Gmachl, C., et al., *IEEE Photonics Technol. Lett.*, vol. 9, p. 1090 (1997); Gmachl, C., et al., *Appl. Phys. Lett.*, vol. 72, p. 1430 (1998).

Unlike other semiconductor lasers, such as diode lasers, the lasing wavelength of a QC laser is essentially determined by quantum confinement, i.e., by the thickness of the layers of the active regions, rather than by the bandgap of the active region material. The lasing wavelength thus can be tailored over a wider range than a diode laser, using the same semiconductor material. For example, QC lasers with InAlAs/InGaAs active regions have been tailored to operate at mid-IR wavelengths in the 3.5 to 13 $\mu$m range.

In addition, diffraction gratings may be used to further control the operation frequency of semiconductor lasers. Examples of this type of laser are DFB lasers, lasers employing DBRs, and grating coupled surface emitting lasers (GCSELs). GCSELs and related technology are described in Lowery, A. J., "Performance Comparison of Gain-Coupled and Index-Coupled DFB Semiconductor Lasers," *IEEE J. Quantuin Electronics*, vol. 30, no. 9, pp. 2051–2063 (1994); Kock, A., "Single-mode and Single-beam Emission from Surface Emitting Laser Diodes Based on Surface-mode Emission," *Appl. Phys. Lett.*, vol. 69 (24), pp. 3638–3640 (1996); Rast, A., et al., "New Complex-Coupled DFB-Laser with a Contacted Surface Grating for $\lambda$=1.55 $\mu$m", *IEEE Proceedings Optoelectronics*, vol. 142, no. 3, pp. 162–164 (1995).

When using a diffraction grating, both the thickness of the active region layers and the diffraction grating determine the lasing wavelength, as follows. In a QC laser, the characteristics of the active region (e.g., the number and layer thicknesses of coupled quantum wells) can be varied to determine the laser emission wavelength range. The diffraction grating is used to precisely pick out a much narrower wavelength range within that determined by the active region layer thickness. The grating controls the lasing wavelength more precisely than the lasing wavelength range determined by the layer thickness alone. However, the lasing wavelength selected by the diffraction grating cannot exceed the available laser wavelength range determined by the layer thickness and the whole laser structure.

Thus, a unipolar injection laser, such as a QC laser, offers several advantages over bipolar semiconductor lasers. Compared to bipolar semiconductor lasers, these QC lasers have a frequency response not limited by electron/hole recombination, a narrow emission linewidth because the line-width enhancement factor is (theoretically) zero, and a weaker temperature dependence of the lasing threshold. Additionally, as noted above, appropriately designed QC semiconductor lasers can have an emission wavelength in the spectral region from the mid-IR to the submillimeter region, which is entirely determined by quantum confinement.

An alternative approach to fabricate a high-power, single-mode laser is to use a so-called "curved grating." In such a laser, with a mode made up of counter-propagating diverging beams, the rulings of the diffraction gratings are curved to reflect one traveling wave into the other. See, e.g., Lang, R. J., "Design of Aberration-Corrected Curved Mirror and Curved-Grating Unstable-Resonator Diode Lasers," *IEEE J. Quantun Electron.*, vol. 30, p. 31 (1994). A method for fabricating the grating for a DFB semiconductor laser is disclosed in "Surface-Emitting Distributed Feedback Semiconductor Laser," S. Macomber et al., *Appl. Phys. Lett.* 51(7) pp. 472–474 (August 1987). This paper describes a technique in which a gold coating is deposited on a grating etched into the p-side of a semiconductor laser. The gold coating also serves as the p-contact for the laser. However, this approach employs an edge-emitting laser structure and has a large beam divergence angle (sometimes referred to as a diffraction angle) along the direction that is perpendicular to the laser surface, as well as a much higher optical power density at the laser facet that it is susceptible to catastrophic mirror damage. An edge-emitting semiconductor laser also typically has a an elliptical, as opposed to circular, laser beam cross-section. This can require correction and collimating, which can be expensive or otherwise impracticable or undesirable. Also, due to the nature of the curved grating, the output laser beam has a spatial phase difference distribution, which reduces optical beam quality.

Many applications also require lasers that operate in the mid-IR spectral range, e.g., between about 3 and 13 $\mu$m. Such applications include remote chemical sensing, pollution monitoring, LIDAR (Laser Infrared Detection and Ranging), infrared counter-measure, and molecular spectroscopy. Unfortunately, there are few convenient laser sources that operate in the mid-IR spectral region. As noted above, for example, bipolar semiconductor diode lasers, including quantum well lasers, have too large a bandgap, making it difficult, if not impossible, to obtain lasing operation at mid-IR wavelengths. Some semiconductor lasers can operate in this wavelength range, but they require special cooling to a very low temperature, which can be costly.

QC lasers, however, as noted above, do not suffer these drawbacks, and can be designed to emit radiation at substantially any desired wavelength in a rather wide spectral region, including emissions in the mid-IR range. Therefore, QC lasers are desirable for such mid-IR range applications. For example, QC lasers may be employed advantageously as radiation sources for absorption spectroscopy of gases and pollutants, because at least some QC lasers can operate in the relevant wavelength region at or near room temperature and with relatively high output power. See, for instance, Faist, J. et al., *Applied Physics Lett.*, Vol. 68, pp. 3680–3682 (1996); and C. Sirtori et al., "Mid-infrared (8.5 $\mu$m) Semiconductor Lasers Operating at Room Temperature," *IEEE Photonic Technol. Lett.*, vol. 9 (3), pp. 294–296 (1997), both incorporated herein by reference.

Some applications require high laser output power, especially single-mode lasers. For example, for LIDAR, differential absorption LIDAR (DIAL), and other remote chemical sensing systems, a spatially coherent, single-mode, high-power laser beam in the appropriate wavelength range can greatly increase the sensing range. Single-mode emissions from QC lasers can be achieved by incorporating a DFB or DBR grating into the laser structures.

It is difficult, however, to achieve a spatially coherent, single-mode, high-power laser beam using conventional edge-emitting QC laser structures as the source of mid-IR radiation. To obtain high output power with an edge-emitting QC laser, one has to use either a very high injection current density into a narrow stripe laser or use a broad area laser to increase the lasing area. A high injection current density will cause severe device heating and thus significantly limit the maximum output laser power and reduce the laser lifetime.

With a broad area laser, on the other hand, it is very difficult to maintain single-mode operation under high current injection operation because of self-induced filamentation problems, which causes multi-mode lasing. See, e.g., G. P. Agrawal & N. K. Dutta, *Semiconductor Lasers* (2nd edition; New York: Van Nostrand Reinhold, 1993). The self-induced filamentation effect produces a multi-spatial mode laser beam, which diminishes the laser's power and performance. The multi-mode laser beam is very difficult to focus, which is especially problematic when a long propagation distance or a very small focus beam size is required. The multi-mode laser beam is less coherent and, thus, very difficult to use in some applications. In addition, as noted above, the output beam of an edge-emitting laser always has a very large divergence angle in the direction perpendicular to the laser top surface.

Surface-emitting QC lasers, by contrast, show great promise for applications requiring high output power. A surface-emitting DFB semiconductor laser has the potential to produce higher single-mode output power than an edge-emitting laser, because a larger lasing area can be used and the internal loss of the laser structure can be reduced. Under current technology, the output from surface emitting lasers can be spatially coherent if the width, or the lateral dimension, of the lasing region is limited to about 5 $\mu$m. To obtain higher output power, however, it is advantageous to provide a lasing region with a width of 50 $\mu$m or more. Unfortunately, simply increasing the width will lead to spatially incoherent operation at high current injection. Thus, there is a need for techniques for fabricating a surface emitting QC laser with both a wide lasing region and a spatially coherent output beam.

Several approaches have been proposed to prevent the filamentation problem in a broad-area semiconductor laser. The typical solution is to create a so-called unstable resonance cavity (also referred to as an unstable resonant cavity or unstable resonator) within the laser device. There are several ways to create this kind of cavity for a high power laser. A semiconductor laser with a continuous unstable resonator has been described in Guel-Sandoval, S. et al., "Novel High-Power and Coherent Semiconductor Laser with a Shaped Unstable Resonator," *Appl. Phys. Lett.*, vol. 66 (1995): pp. 2048–2050, which is incorporated herein by reference in its entirety. This paper describes a means for inducing a quadratically varying index of refraction across the lateral dimension of a wide-stripe semiconductor laser, to cause beam divergence and coherent operation in the laser. Another approach, using a curved grating, is described in the Lang reference, described above.

A new way to fabricate a grating-coupled surface-emitting diode laser with an unstable resonance cavity is disclosed in aforementioned U.S. Pat. No. 5,727,016. This patent describes the use of a variable index refraction layer, having an approximately parabolic-shaped trough therein. The refraction layer is positioned adjacent to the active lasing region. A straight-toothed, second-order diffraction grating contacts the refraction layer to produce a broad, spatially coherent output beam. Kastalsky, A., "Infrared Intraband Laser Induced in a Multiple-Quantum-Well Interband Laser," *IEEE J. Quantum Electronics*, vol. 29, no. 4, pp. 1112–1115 (1993).

Therefore, there is a need for improved surface-emitting QC lasers, which produce high-power, spatially coherent, single-mode output beams, having a small divergence angle. Such devices especially would be useful, for example, for remote chemical sensing and LIDAR applications. A compact, low-cost and reliable high-power, spatially coherent, single-mode, mid-IR semiconductor laser can greatly reduce the system cost and reliability for these applications.

BRIEF DESCRIPTION OF THE DRAWINGS

Other features and advantages of the invention will become apparent upon study of the following description, taken in conjunction with the drawings in which.

DESCRIPTION OF THE PREFERRED EMBODIMENT

Figure 1:
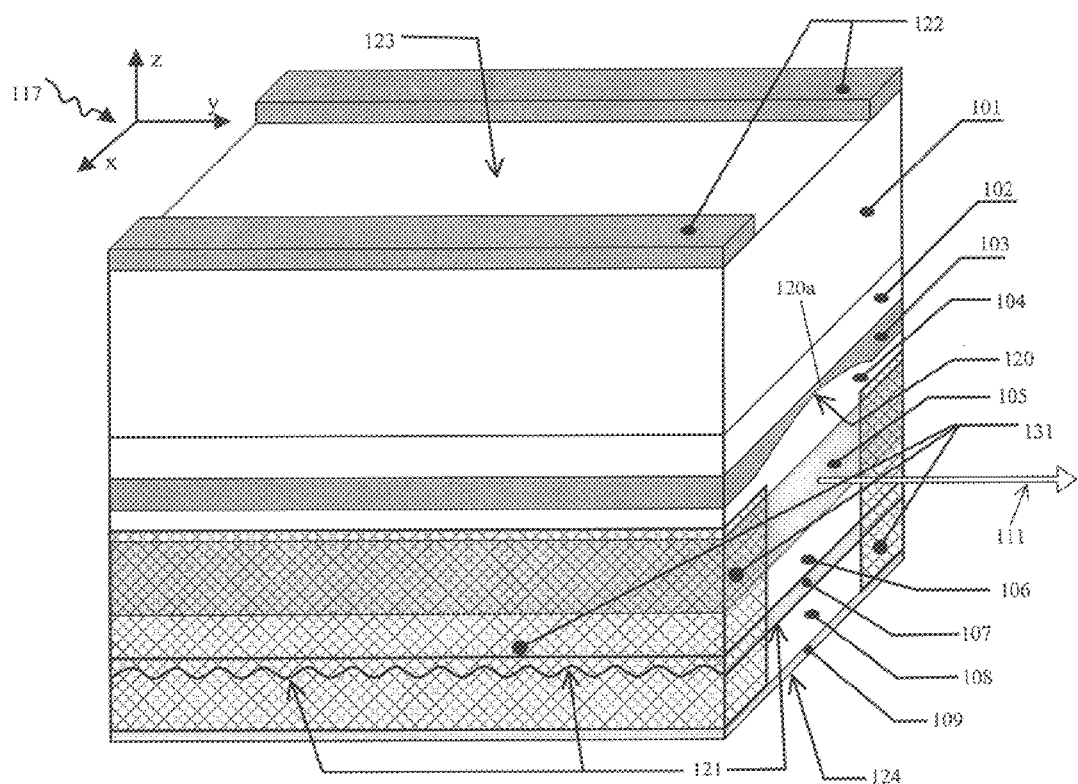
FIG. 1 is a cross-sectional view showing the epitaxial structure of a QC laser in accordance with an embodiment of the present invention.

The present disclosure describes a high-power, spatially coherent, single-mode, surface-emitting, unipolar QC laser, and method for fabricating it. The QC laser of the present invention is a modified unipolar QC laser structure that incorporates grating-coupled, surface-emitting, and unstable resonance cavity structures. It may be used, for example, as a mid-IR laser source.

The grating-coupled, surface-emitting structure of the present invention provides the advantage of a narrow spectral width laser output with a small divergence angle, and the unstable resonance cavity structure provides the advantage of preventing the filamentation effect that causes multimode lasing under high injection current. The combination of these two structures allows the laser to maintain narrow spectral, single mode, and small diffraction output at high injection current. This combination in a unipolar QC laser also allows lasing emissions.to be achieved over a wide spectral region, including wavelengths in the mid-IR range. Also, because it is surface-emitting, the GCSEL of the present invention typically can have a circular laser beam and a smaller divergence angle, and can therefore be more attractive than edge-emitting lasers in some applications.

Repeat Units

The QC laser of the present invention is a unipolar semiconductor laser having a multilayer stacked structure grown on a semiconductor substrate, typically InP, which forms an optical waveguide structure. The optical waveguide structure includes a core or active region of relatively large effective refractive index (e.g., 3.3) between cladding regions of relatively small effective refractive index (e.g., 3.1). A cladding region will also be referred to herein as a "confinement region." The core region comprises a plurality of repeat units, each unit having essentially an identical active (RT) region (or gain medium) and a carrier injection/relaxation (I/R) region, as described above. The core region generates lasing when electrical power is applied to the structure through electrodes. The lasing light propagates within the optical waveguide, which includes the core region, in the longitudinal direction of the cavity, where it is amplified by the lasing action. The nominal structure of this aspect of the QC laser of the present invention is similar to that described the aforementioned U.S. Pat. No. 5,509,025.

Diffraction Gratings

As noted above, diffraction gratings may be used further to control the operation frequency of semiconductor lasers by helping to select a narrower lasing frequency range within the frequency range set by the laser structure itself. Grating coupled DFB structures, for example, have been applied to the basic QC laser structure to produce single-mode lasers with a selected wavelength. These DFB lasers use only the first order grating. For example, a first order grating may be used to couple light in the longitudinal direction of the laser cavity (edge emitting).

Gratings can also be made for use of higher coupling orders, as will be appreciated by those skilled in the art. To fabricate a surface-emitting laser, for example, one can incorporate a second order grating into a laser structure to produce a grating coupled surface-emitting laser. Diode lasers with grating coupled surface emitting structures are well known. See, for instance, the aforementioned Kock reference, which discloses a surface-emitting bipolar laser diode with a second-order grating in the top-cladding layer, the grating facilitating coupling of the laser cavity mode into a surface mode. A second order grating causes vertical coupling, instead of in the cavity longitudinal direction.

The main advantage of a surface coupled laser is that the output light has a much smaller divergence angle than a conventional edge-emitting laser, and can be circular in cross section rather than elliptical, as in the case of edge-emitting lasers. Light with a smaller divergence angle and circular cross section is easier to focus into a smaller spot size or collimate into a laser beam that can maintain a smaller spot size after the beam has traveled a long distance, and easier to couple into a fiber or other light-receiving device. The QC laser of the present invention employs a grating-coupled, surface-emitting structure, to provide a narrow spectral linewidth (e.g., on the order of MHz) laser output having a small divergence angle (e.g., 1°).

Unstable Resonance Cavity

The QC structure employs a lens-like media structure so that the resonance cavity is a continuous unstable resonator or resonance cavity. The aforementioned Guel-Sandoval el al. reference describes such an unstable resonator. This reference describes a means for inducing a quadratically varying index of refraction across the lateral dimension of a wide-stripe semiconductor laser that forms a lens-like media to cause beam divergence. Such beam divergence prevents the formation of filamentation within the laser stripe, thus allowing coherent single mode operation in the laser to be maintained even at high current injection.

Thus, in the QC laser structure of the present invention, a lens-like media structure is incorporated to form an unstable resonance cavity. The lens-like structure has an interface between layers of different refractive index, where the interface has a quadratically varying "trough"-shaped profile along a direction transverse to the direction of the laser resonance oscillation cavity. The resonance cavity of the QC laser structure is a cavity for laser light in the longitudinal dimension, and is made unstable by the lens-like media structure. The presence of the lens-like media structure causes the lasing mode to be shared between primary and secondary regions of a "double" optical waveguide, where the secondary region (with the lens-like media structure) acts as a lateral antiguide, as will be appreciated by those skilled in the art. The resulting antiguiding causes higher cavity losses for off-axis higher order modes, and discriminates in favor of fundamental spatial mode operation. Increasing the depth of the trough profile increases the index variation, and therefore the antiguiding, causing a stronger divergence of the higher order lasing modes. Therefore, the lateral radius of curvature of the mode wavefront (and therefore cavity magnification) can be adjusted by selecting the depth and width of the trough profile of the lens-like media structure. As will be understood by those skilled in the art, care must be taken when using such a double optical waveguide to avoid too strong a coupling to the secondary waveguide, which could cause higher order transverse modes to be supported, thereby degrading laser coherence.

The laser's lasing mode of diverging counter-propagating traveling wave beams is generated by the cascaded active layers within the core region when a sufficient number of carriers are injected into the device through the contact metal (electrodes). The traveling wave beams interact with a grating structure that produces first and second order Bragg diffraction, resulting in a wide coherent output laser beam (surface emitted).

The second order Bragg diffraction provides the feedback (or reflection) of the selected laser wavelength to form the resonant oscillations, which is the foundation of laser operation. The first order Bragg diffraction couples the laser light within the resonance cavity into the surface normal direction for surface-emitted laser output. Thus, through the use of the unstable resonance cavity, the QC laser of the present invention is able maintain single mode operation at high injection current, by preventing the filamentation effect that would otherwise cause multimode lasing under high injection current.

QC Laser Structure and Fabrication

In one embodiment, the QC laser of the present invention comprises at least one grating structure for providing surface emitting coupling, and one lens-like variable index of refraction structure for providing an unstable resonance cavity. The profile of the grating structure can be of any reasonable periodic shape, not limited to sinusoidal, round, triangular, trapezoidal, and the like. The grating structure and the variable index of refraction layer (or layers) are spaced from the core region such that electromagnetic radiation in a confined laser mode has non-zero intensity (e.g., 0.1% or more of the peak intensity of the mode) at these structures. The grating-coupled, surface-emitting, unstable resonance cavity, unipolar QC laser of the present invention, therefore, can produce a single spatial mode, high-power, mid-IR laser beam, without causing catastrophic mirror damage. The present invention thus can improve the laser beam quality of a high-power QC laser over conventional edge-emitting lasers.

Referring now to FIG. 1, a cross-sectional view illustrating the epitaxial structure of a QC laser 100 is shown in accordance with an embodiment of the present invention. The QC laser 100 comprises a substrate layer 101, which, in one embodiment, consists of a Group III–V semiconductor material, such as indium phosphide (InP). The QC laser 100 is preferably formed using material growth and etching techniques, such as photolithographic techniques, as will be described in more detail below with reference to FIGS. 3 and 4. As will be appreciated by those skilled in the art, the structure of the QC laser 100 is formed by adding layers of material (e.g., growing, depositing, etching, and the like), such as Group III–V semiconductor material, consecutively onto the substrate layer 101, in the negative (−)z direction (i.e., downward) in a coordinate system 117 shown in FIG. 1. Therefore, layer 102 may be said to be formed "on top" of layer 101, although it is depicted as being "below" layer 101 in the view illustrated in FIG. 1.

As will be appreciated by those skilled in the art, and as will be described in more detail below with reference to FIG. 5, the QC laser 100, when properly coupled to a current (or voltage) source and a heat sink, produces a laser beam emitted from a surface 123 of the substrate 101 that travels upwards in the positive (+)z direction from the surface 123. The laser beam is emitted when electrical current is run through the structure from metal stripe contacts 122 to ohmic contact layer 109.

Layer 102 is a buffer layer for the growth of the laser structure. The surface of a substrate, such as the substrate 101, is typically not very smooth on an atomic scale and has many contaminating impurities on it. The buffer layer 102 typically is used in semiconductor material epitaxial growth to form a smooth and clean surface for the growth of a high quality device structure, as will be appreciated by those skilled in the art. The buffer layer 102 may be constructed of InP, indium-gallium-arsenide-phosphide (InGaAsP), indium-aluminum-arsenide-phosphide (InAlAsP), indium-aluminum-gallium-phosphide (InAlGaAs), or other Group III–V materials, or, in an alternative embodiment, is not present at all. Layer 103 is constructed of a material having a relatively larger refractive index (e.g., 3.3) than that of a smoothing bottom cladding layer 104 (e.g., 3.1) at the designed laser wavelength λ (e.g., a mid-IR range wavelength) to form a lens-like media structure having a variable index of refraction interface 120, for providing an unstable resonance cavity.

In one embodiment, after the epitaxial growth of the layer 103 during the process of constructing the QC laser 100, the device wafer sample is taken out of the growth chamber to form the interface 120. The interface 120 is formed by etching an approximately quadratically varying "trough" (or "dip")-shaped profile along the x-direction of the laser resonance oscillation cavity, which is in a direction transverse to the y-direction of the coordinate system 117 in FIG. 1. The laser resonance cavity is formed along the longitudinal direction of the coordinate system 117 and uses a DFB grating, indicated by interface 121, as the cavity "end" reflectors. The cavity includes the region bounded in a plane parallel to the "plane" of the grating and between two facets cleaved in a direction transverse to the grating lines at opposite ends of the device. The two facets are usually coated with anti-reflection coating to avoid facet reflections. The resonance is provided by reflections due to grating coupling of counter-propagating traveling wave beams produced in the cavity, as will be appreciated by those skilled in the art. To discriminate against higher order laser cavity modes in favor of the fundamental laser cavity mode, defocusing of the modes is accomplished by etching the lens-like media to form the trough in the layer 103. The refractive index of the layer 103 must be larger than that of the layer 104, e.g. layer 103 in an embodiment has a refractive index of approximately 3.3 and layer 104 has a refractive index of approximately 3.1.

A bottom cladding layer 104 consists of a material such as Group III–V materials like InAlGaAs, InGaAsP, InAlAsP, InP, and the like. As will be appreciated, the applicable mole fractions important and ranges depend on the particular embodiment, application and design. The function of the cladding layer 104 is to smooth the interface 120 of the etched trough for later growth of other layers and to provide a refractive index-changing lens-like profile for the unstable resonance cavity. The cladding layer 104 preferably consists of InP, which has been found to have the best growth smoothing effect.

A layer 105 is the waveguide core region, which is a periodic structure constructed from alternating semiconductor layers, for example, alternating InGaAs and InAlAs layers, that have different carrier (e.g., electron) affinities in an energy band (e.g., the conduction band). The alternating layers can emit photons through inter-subband transitions (i.e., within the same energy band, such as the conduction band), in similarity to that disclosed in the aforementioned U.S. Pat. No. 5,509,025 patent. The layer 105 thus can comprise InAlAs/InGaAs multi-layer semiconductor repeat units, each having an active (RT) layer (i.e., gain medium) and an I/R layer, as described above. The QC laser 100 includes the first and a second cladding region 104 and 106, respectively, with the core region 105 therebetween, and further comprises electrical contacts 122 and 109 selected to facilitate the flow of an electrical current through the laser. The core region 105 includes a plurality (e.g., 10 or more, but typically more than 20) of essentially identical multilayer semiconductor repeat units selected for lasing in a wavelength range centered around the particular desired lasing wavelength $\lambda$. The repeat units are nominally identical, with any differences typically being due to unavoidable or unintended variations during material growth or device fabrication, as will be appreciated by those skilled in the art.

The interface 120 between the cladding layer 104 and the layer 103 is the trough-shaped etched surface on the layer 103 that provides a gradual change of the effective refractive index within the lateral x-direction of the laser resonance cavity to defocus the laser mode to prevent or at least substantially reduce the detrimental filamentation effect, as discussed above. The trough shape of the interface 120 extends along the direction of a longitudinal axis 111 parallel to the resonance cavity of the laser (i.e., parallel to the y-axis of the coordinate system 117). The shape of the interface 120 is selected to cause a quadratic (e.g., parabolic)-like variation of the effective index of refraction in the lateral dimension (i.e., the x-direction of the coordinate system 117). See the aforementioned Guel-Sandoval paper. A quadratic profile is preferable to produce an output laser beam with a small divergence angle (e.g., approximately 1°, depending on width), although, in other embodiments, other profiles may be employed, such as spherical, triangular, and the like.

It is also preferable for the lens-like media structure (which includes of the layers 103 and 104, and the etched interface 120 between them) that the effective refractive index in the lateral x-direction within the resonance cavity has its smallest value along the axis 111 at a center 120a (in FIGS. 1, 3(b), and 3(c)) of the laser cavity (i.e., at a centralized portion of the laser proximate or along the axis 111) and monotonically increases when moving away from the center in the x-direction. Therefore, an alternative way of constructing the lens-like media structure to defocus the lasing mode is to choose the refractive index of the layer 103 to be smaller than that of the layer 104 (as noted above, with refractive indices in the range of 3.1 to 3.4, in an embodiment) and form a "bump" profile rather than a "trough" or "dip" profile in the layer 103. In other words, if the "trough" or "dip" profile of FIG. 1 is termed "concave," then the "bump" profile is termed "convex." Techniques, such as photolithographic techniques, to form such a "bump" or "dip" profile are known to those skilled in the art. In one embodiment, the "dip" profile is used when the refractive index of the layer 103 is larger than that of the layer 104 and a "bump" profile is used when the opposite is true. For example, the "dip" profile may be used for the interface 120 when the layer 104 consists of InP and the layer 103 consists of InGaAsP, which has a larger refractive index than that of InP at the laser wavelength. In an embodiment, InP has a refractive index of approximately 3.1, and InGaAsP has a refractive index of approximately 3.1 to 3.4, if lattice matched to InP.

If the profile of the etched interface 120 is selected to produce a quadratically changing refractive index profile, and if it is assumed that the effective refractive index of the laser waveguide has a minimum value of n, at the center of the laser resonance cavity in the x-direction (i.e., for x=0) (i.e., at the centralized portion 120a), then a profile can be etched having an effective refractive index profile along the x-axis of $n=n_c+n_2x_0^2$. In this equation, $x_0$ is the x-axis position of any particular point on the profile and $n_2$ is the coefficient of the effective refractive index variation, as will be appreciated by those skilled in the art. Semiconductor lasers with this index of refraction profile are discussed in the aforementioned Guel-Sandoval et al. reference.

The lens-like media structure that produces the position-variable refractive index profile can be located either under the core region 105, as illustrated in FIG. 1, or above the core region 105. Its position can be selected depending on the ease of the fabrication procedures and the effective coupling strength of the grating.

The core region 105 functions as an optical confinement and wide lasing region with one or more active regions within it. As an example, the core region 105 might include InGaAs, InAlAs, and InP multilayers containing one or more active regions that can produce mid-IR lasing through inter-subband transitions, and carrier injection/energy relaxation regions to inject, relax, and recycle the injected carriers. The mole fractions employed depends on the structure and lasing wavelength. For example, for a wavelength >5 $\mu$m, lattice matched $In_{0.53}Ga_{0.47}As$ and $In_{0.52}Al_{0.48}As$ may be employed.

Examples of such structures are described in the aforementioned U.S. Pat. Nos. 5,457,709, 5,509,025, and U.S. Pat. No. 5,901,168. On top (i.e., along the −z direction) of the core region 105, a moderately n-doped (e.g., $5\times10^{17}$ $cm^{-3}$) InP or InAlGaAs layer of material is used as the first top cladding layer 106. A grating fabrication or etching layer 107 is then grown on top of the layer 106. The layer 106 is used to separate the core region 105 and the grating etching layer 107. After growth of the layer 107, the device sample is taken out of the growth chamber again for grating fabrication. By controlling the thickness of the layer 106 and the grating profile, the coupling strength (between the counter-propagating waves and between them and the output laser light)of the grating can be controlled. The grating is fabricated by etching a periodically varying depth profile into the layer 107, as indicated by the corrugated profile or interface 121. Techniques to do such etching are know to those skilled in the art.

The interface 121 varies longitudinally along the y-axis. The device wafer sample is then placed back in the growth chamber and a layer 108 is grown as a second top cladding layer and also serves to smooth out the grating surface. The layer 108 is deposited or grown on top of the etched grating, and may consist of InP, InAlAs, or InGaAsP. On top of the layer 108, a highly n-doped (e.g., $1\times10^{19}$ $cm^{-3}$) small bandgap layer, preferably InGaAs, is grown to serve as an ohmic contact layer 109. The layer 109 provides a low electrical resistivity layer to a contact metal for current flow.

The grating period is selected using techniques known to those skilled in the art so that a condition for Bragg diffraction is satisfied at the desired target laser wavelength. A second order Bragg grating preferably is used for this purpose, but higher order gratings may also be used. The nominal depth and profile of the grating and the refractive index difference between the layers 107 and 108 determine the effective grating coupling coefficient (for laser output and reflection back).

The diffraction grating is used to further control the lasing frequency. As noted above, both the characteristics of the active regions of the core region 105 (e.g., the thickness of the active region layers) and the diffraction grating determine the lasing wavelength. The active regions determine an initial laser emission wavelength range, i.e., a range centered around, or at least including, the wavelength $\lambda$ that will be the lasing wavelength. The diffraction grating acts as a filter that narrows the linewidth further and selects the lasing wavelength within this initial wavelength range. The grating allows a more precise and narrower lasing wavelength range than is possible by simply selecting the active region layer thickness.

The choice of the nominal distance between the interface 121 and the core region 105 depends primarily on the coupling coefficient between the resonance optical mode and the grating structure defined by the interface 121. The thickness of the layers 106 and 107 can be adjusted to produce the desired coupling strength between the grating and the resonance optical mode. The total thickness of the layers 106 and 107 can range from 0 to more than 1.0 $\mu$m, for example, depending on the device design and the lasing wavelength.

The grating structure may be composed of either an index-coupled or a complex-coupled grating structure, as will be appreciated by those skilled in the art. The layer 107 may be composed of single-layer material or multi-layer materials for the grating fabrication. In one embodiment, the grating lines or grooves defined by the interface 121 have a periodic spacing such that the second order Bragg diffraction feeds the waveguide mode traveling in the direction opposite to the incident waveguide mode. The grating grooves form periodic parallel straight lines that preferably are parallel to the x-axis in the x-y plane of the coordinate system 117 in FIG. 1.

Figure 2:
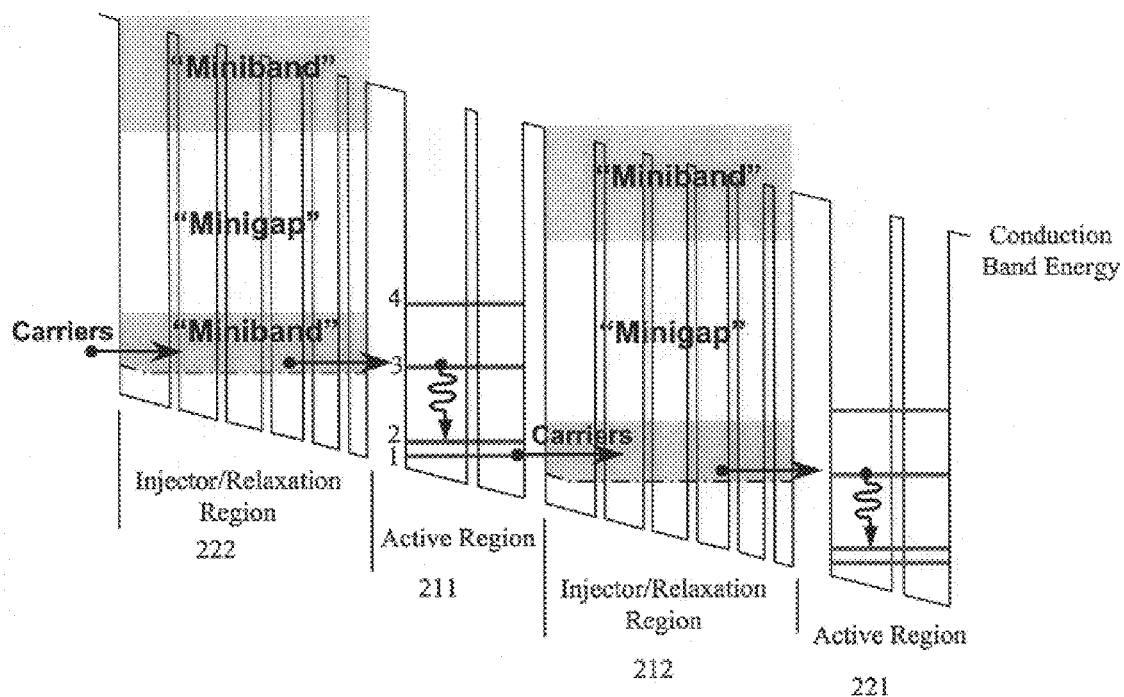
FIG. 2 is a schematic drawing of the conduction band energy diagram for an exemplary active region and I/R region inside the core region of the QC laser of FIG. 1, also showing neighboring active and I/R regions.

Referring now to FIG. 2, a schematic drawing of a portion of a conduction band energy diagram 200 is shown for an exemplary active region 211 and I/R region 212 inside the core region 105 of the QC laser 100. Neighboring active and I/R regions 221 and 222, respectively, are also shown. In one embodiment, the higher conduction band energy layers preferably are composed of $In_{0.52}Al_{0.48}As$ and those with the lower conduction band energy preferably are composed of $In_{0.53}Ga_{0.47}As$. As will be appreciated, other mole fractions or ranges may be employed in alternative embodiments, depending upon the application and design. There are four confined energy levels shown in the coupled dual-quantum well active region 211, denoted by reference numerals 1, 2, 3, and 4, respectively. More than four confined energy levels are possible within each active region (e.g. the region 211), depending on design details and constraints, as will be appreciated by those skilled in the art.

Also, as will be appreciated by those skilled in the art, each active region 211 has a layer structure selected to provide an upper carrier energy state (e.g., the energy state 3 in this case).and a lower carrier energy state (e.g., the energy state 2 in this case). Carrier injection from the I/R region 222 produces carrier inter-subband transitions from the upper to the lower energy state, and results in emission of photons of a desired wavelength λ (within a certain range), corresponding to the difference in these energy states, with or without stimulation. Each I/R region, such as the I/R region 212, also has a layer structure selected to facilitate carrier transport from the lower energy state of the active region of a given repeat unit of which the I/R region is also a part, to the upper energy state of the active region of the adjacent ("downstream") repeat unit (e.g., the active region 221), when the device is coupled to a current source (or under a bias voltage). For example, the layer structure of the I/R regions can be selected to form a so-called "superlattice" having associated carrier "miniband" energy bands, as shown in FIG. 2, as will be appreciated by those skilled in the art. A carrier thus undergoes successive transitions from an upper to a lower energy state as the carrier moves through the core region 105 layer structure, resulting in the creation of a plurality of photons of the desired wavelength λ. The photon energy (and thus λ) therefore depends on the structural and compositional details of the repeat units, in particular the thicknesses of the active region layers, as described above.

Although the active regions of the core region 105 are illustrated as coupled dual-quantum well structures, in alternative embodiments, the structure of each active region can be a single quantum well, multiple quantum wells, superlattices, or the like. The active regions can be designed using any of these structures to provide and optimize desired device performance.

The QC laser of the present invention may be formed utilizing suitable processing steps, as described below, including mesa etching, insulation dielectric layer deposition, electrical contact metal depositions, facet cleavage, facet coatings, and the like. Referring now to FIGS. 3(a)–(c) and FIGS. 3(d)–(e), etching and material growth steps of a technique for fabricating a grating-coupled surface-emitting QC laser, such as the QC laser 100 of FIG. 1, are illustrated in accordance with an embodiment of the present invention. FIGS. 3(a)–(c) are front cross-sectional views and FIGS. 3(d)–(e) are side cross-sectional views, respectively. For example, the technique could be used to fabricate a QC laser having layer thicknesses and a structure such that photons at a wavelength of approximately 7.8 $\mu$m are emitted. In the more detailed description of the technique that follows, although specific materials and mole fractions are disclosed, as will be appreciated by those skilled in the art, other materials and mole fractions could be used, depending on the desired laser design and structure.

According to the technique, to fabricate the QC laser 100, the first bottom cladding layer 102 (e.g., of InP) and the lens surface etching layer 103 (e.g., of InGaAs) are grown on the substrate 101 (e.g., of InP) to form a surface 110 for the lens-like profile etching, as shown in FIG. 3(a). The etching step may be a multi-step etching with varying mask width or photo-assisted etching. In one embodiment, the substrate layer 101 is a moderately n-type doped InP substrate, the first bottom cladding layer 102 is an approximately 300 nm thick moderately n-type doped InP (e.g., $5\times10^{17}$ cm$^{-3}$) buffer layer, and the lens surface etching layer 103 is an approximately 120 nm thick moderately n-type doped InP (e.g., $5\times10^{17}$ cm$^{-3}$) $In_{0.53}Ga_{0.47}As$.

Next, the device wafer sample is taken out of the growth chamber to perform the etching of a "trough" that is approximately 80 nm deep and approximately 300 $\mu$m wide, which is shown as the profile 120 in the layer 103 in FIG. 3(b). After this etching step, the result, as shown in FIG. 3(b), is a shallow "dip" profile centered within the targeted laser stripe structure. As an example, for a QC laser having a lasing wavelength of approximately 8 $\mu$m, the deepest part of the "dip" profile can be approximately 60–120 nm. The thickness of the layer 102 is approximately 300 nm and that of the layer 103 is approximately 200 nm in this exemplary embodiment.

The sample then is put into the growth chamber again to grow the second bottom cladding layer 104 (e.g., of InP), the core region 105, the first top cladding layer 106 (e.g., of InP), and the grating etching layer 107 (e.g., of InGaAs) consecutively on top of the surface 120, which results in the profile shown in FIG. 3(c) and in the side view of FIG. 3(d). The second bottom cladding layer 104 is composed of a nominal approximately 200 nm thick moderately n-type doped (e.g., $5\times10^{17}$ cm$^{-3}$) material (e.g., InP) to smooth out the trough surface. The core region 105, for example, is a periodic Group III–V semiconductor multilayered structure (e.g., of InGaAs and InAlAs) that can produce mid-IR lasing through the inter-subband transitions. The core region or layer 105 in the exemplary disclosed embodiment includes 30 periods of an $In_{0.53}Ga_{0.47}As/In_{0.52}Al_{0.48}As$ multi-layer cascaded structure in which each period is approximately 44.3 nm thick and the total thickness is approximately 1.329 µm. Other mole fractions may be employed as well.

The first top cladding layer 106 is an approximately 250 nm thick moderately n-type doped layer (e.g., of InP) and the grating etching layer 107 is an approximately 350 nm thick moderately n-type doped layer (e.g., of $In_{0.53}Ga_{0.47}As$). In an alternative embodiment, for example, the thicknesses of the layers 104, 106, and 107 are approximately 250 nm, 100 nm, and 300 nm, respectively.

Figure 3:
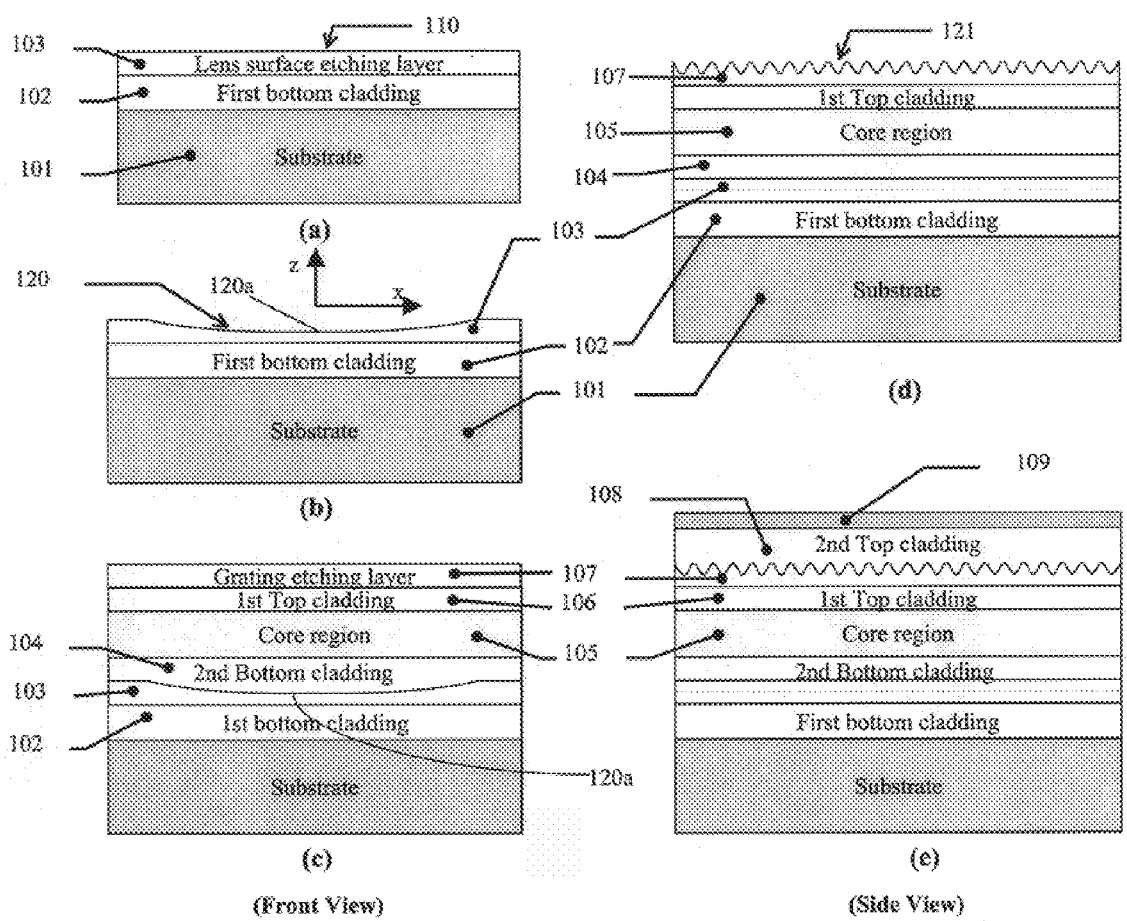
FIGS. 3(a)–(c) are front cross-sectional views and FIGS. 3(d)–(e) are side cross-sectional views, illustrating the etching and material growth steps of a technique for fabricating a grating-coupled surface-emitting QC laser, such as that of FIG. 1, in accordance with an embodiment of the present invention.

As illustrated in the side view of FIG. 3(*d*), after this growth procedure, the sample then is taken out from the growth chamber again to fabricate the grating with the desired periodicity and profile into the layer 107 to form the second order DFB grating interface 121. The etching depth of is the grating grooves of the interface 121 is approximately 250 nm into the layer 107.

As shown in FIG. 3(*e*), the sample then is loaded into the growth chamber once again for final growth of the layers 108 and 109. The second top cladding layer 108 is a nominally approximately 1.24 µm thick moderately n-type doped (e.g., $5 \times 10^{17}$ cm$^{-3}$) cladding layer (e.g., of InP), one function of which is to smooth the corrugated grating interface surface 121, as discussed above. The layer 109 is an approximately 20 nm thick highly n-type doped (e.g., $1 \times 10^{19}$ cm$^{-3}$) ohmic contact layer (e.g., of $In_{0.53}Ga_{0.47}As$) grown on top of the layer 108 on top of the grating interface 121. At this point, the device wafer sample is ready for typical laser device processing such as metal contact deposition, electrical isolation fabrication, device dicing, anti-reflection coating, and so forth, as described in more detail below.

It should be noted that, for second-order grating coupling, the laser light coupled into the perpendicular direction (i.e. in the z-direction) relative to the grating surface "plane" (i.e., an x-y plane) is theoretically halved, one half propagating upward and the other half propagating downward relative to that plane. In practice, this light may not exactly amount to one-half in each case. The "plane" of the grating surface is also parallel to the plane of the resonance cavity. A contact metal layer 124 deposited on the layer 109 also serves as a mirror or reflecting surface to reflect the laser beam that is coupled into the downward (−z) direction by the grating structure 121 in FIG. 1 into the upward (+z) direction. In one embodiment, this reflecting surface is at the bottom of the layer 109 (at a metal interface 124, as shown in FIG. 5). If there is no mirror or reflecting surface on the layer 109, then a large fraction of the laser light coupled downward will be lost, decreasing the output power of the QC laser. On the other hand, if there is a mirror or reflecting surface on the layer 109, the reflected light from the metal interface 124 preferably has the same phase as the light that is coupled upward. This means that the light coupled downward that is reflected back from the mirror of the layer 109 needs to travel a total distance that is equal to an integer multiple of the effective wavelength when it reaches the grating interface 121 again, as will be appreciated by those skilled in the art. If the reflected light is not coherent with the light coupled upward, total laser performance will be reduced, also as will be appreciated by those skilled in the art. Therefore, to improve laser performance, the distance between the interface 124 and the effective grating plane should be properly selected so that the reflected laser light is in-phase (or substantially in-phase) with the laser light coupled upward, i.e. the distance traveled must be an integer number of wavelengths.

In an alternative embodiment, another QC laser similar to the QC laser 100 is fabricated with a mirrored or reflecting surface on the grating itself, instead of on the metal interface 124 at the bottom of the layer 109. The mirrored surface may be deposited directly on the grating interface 121 without the layers 108 and 109 (see, e.g., the aforementioned U.S. Pat. No. 5,727,016). In this case, the downward coupled light travels zero (or approximately zero) wavelengths from the interface 121, preferably yielding light traveling upward and in-phase with the upwardly coupled light from the grating. This fabrication method can provide an easier way to make a grating coupled surface-emitting laser than by fabricating the layers 108 and 109 and the mirrored surface on the layer 109. However, depositing the metal contact directly on the grating surface at the interface 121 can be undesirable due to optical absorption of the contact metals and higher resistivity of the metal contact. Also, the optical power density at the interface 121 is much larger than that at the metal interface 124 with the same resonant laser power density within the core region 105. The higher the optical power density at the metal interface, the more the optical power is absorbed by the metal contact layer, which leads to higher loss and degrades laser performance. When the absorbed optical power is too high, it will cause too much heating to the metal layer so that eventually catastrophic mirror damage will occur, destroying the laser. Thus, assuming the metal absorption coefficient is the same in both embodiments, a much lower optical power density can cause catastrophic damage in the structure with the metal deposited directly on the grating. Therefore, it is preferable to use the mirrored surface at the interface 124 instead of at the interface 121 for very high output power.

After completing all the above material growth and fabrication procedures, additional device definition and processing procedures can be performed to complete fabrication of the QC laser. Such procedures typically include, for example, etching or ion implantation into part of the materials (such as the areas 131 indicated in FIG. 1) to form an electrical confinement structure; deposition of contact metals on the layer 109 for an epitaxial or growth side electrical contact; thinning down the substrate 101 (from its "bottom" side) and depositing contact metals (conducting stripes) 122 for back side electrical contact; depositing anti-reflection coating layers on the bottom surface 123 of the substrate 101; and cleaving or dicing individual devices from the device wafer sample.

Electrical isolation of the laser resonance cavity, as shown in the areas 131 in FIG. 1, that are covered by the mesh lines, confines injected carriers within the laser resonance cavity. A conventional mesa etching structure or a buried confinement mesa structure with regrowth that covers the mesa sidewalls can define the isolation area. It can also be defined by proton and/or oxygen bombardment of the areas 131 within the layer 105 to destroy the electrical conductivity outside the laser stripe, or by other types of bombardment. These techniques will be appreciated by those skilled in the art. In the exemplary disclosed embodiment, the stripe dimensions in one embodiment are approximately 150 µm wide in the x-direction and approximately 1.5 mm long in the y-direction, as defined by the isolation areas 131. The laser chip can be considerably longer than the conducting stripe so that optical power is small at the cleaved facets at the two end surfaces of the QC laser 100 chip along the y-direction.

Figure 4:
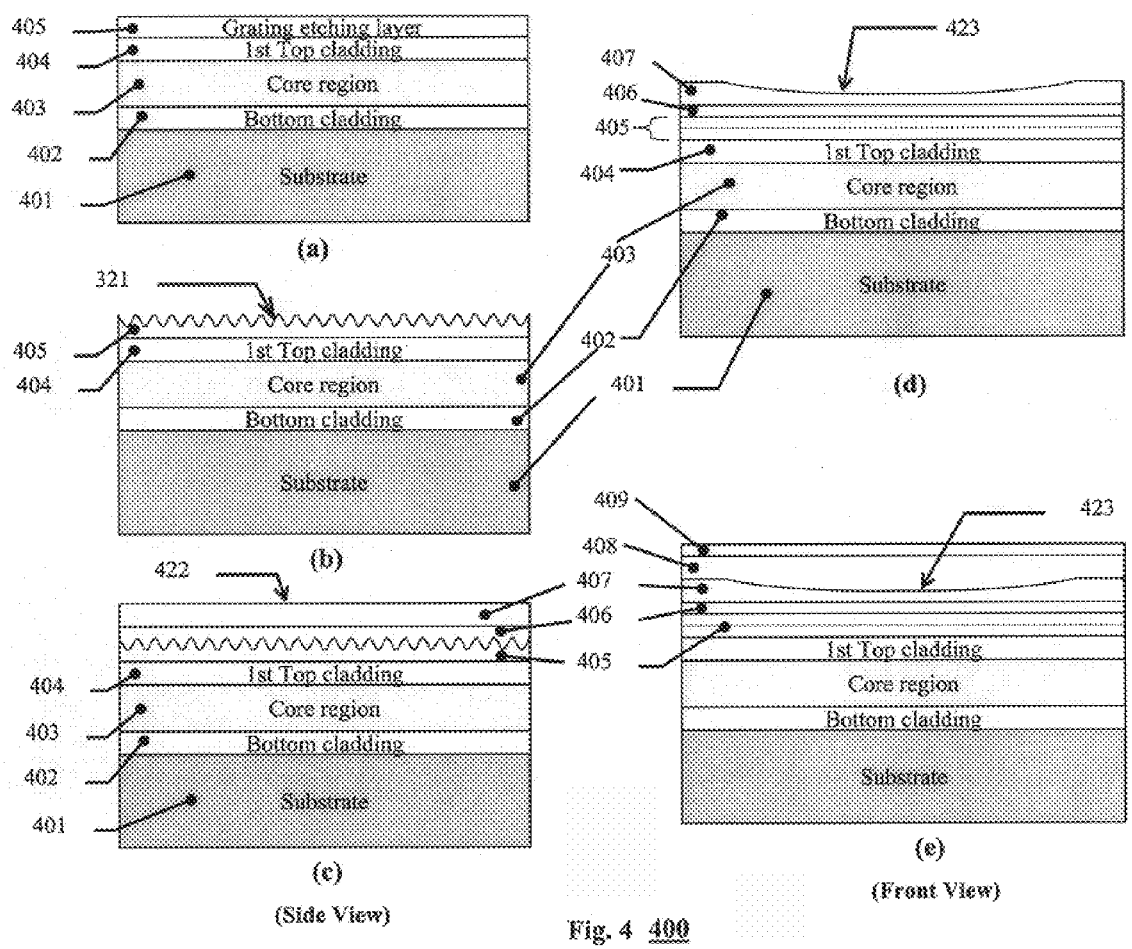
FIGS. 4(a)–(c) are side cross-sectional views and FIGS. 4(d)–(e) are front cross-sectional views, illustrating the etching and material growth steps of a technique for fabricating a grating-coupled surface-emitting QC laser, such as that of FIG. 1, in accordance with an embodiment of the present invention.

Referring now to FIGS. 4(*a*)–(*e*), the etching and material growth steps of an alternative approach for fabricating a grating-coupled, surface-emitting QC laser structure are shown, in accordance with an embodiment of the present invention. FIGS. 4(*a*)–(*e*) are side cross-sectional and front cross-section views, respectively, in similarity to FIGS. 3(a)–(e). First, the bottom cladding layer 402 (e.g., of InP), an active region 403 (similar to the active region 105 in FIGS. 1 and 3(a)–(e)), a first top cladding layer 404 (e.g., of InP), and a grating etching layer 405 (e.g., of InGaAs) are grown on top of a substrate 401 (e.g., of InP), as shown in FIG. 4(a). Then, a grating surface interface 421 is etched into the layer 405, as shown in FIG. 4(b). Next, a smoothing layer 406 (e.g., of InP) and an etching layer 407 (e.g., of InGaAs) are grown on the grating surface 421, as shown in FIG. 4(c). A lens-like profile is then etched into the layer 407 to form a trough-like surface 423, as shown in FIG. 4(d). The lens-like profile of the surface 423, like that of the surface 120 in FIG. 3, is preferably a quadratic profile. Next, a smoothing and cladding layer 408 (e.g., of InP) and an ohmic contact layer 409 (e.g., of InGaAs) are grown onto the surface 423, as shown in FIG. 4(e).

Figure 5:
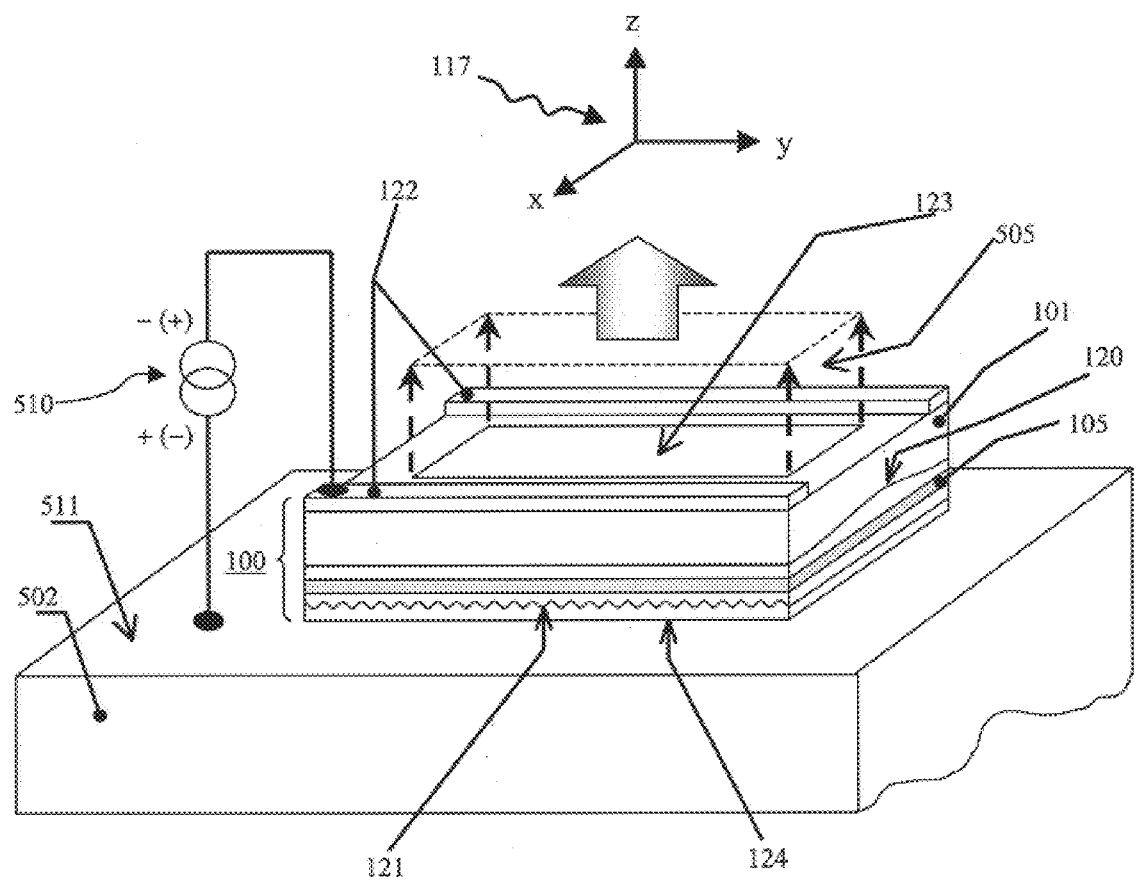
FIG. 5 is a perspective view of a fabricated QC laser incorporating the QC laser structure of FIG. 1 coupled to a heat sink and a current source, in accordance with an embodiment of the present invention.

Referring now to FIG. 5, a fabricated and assembled QC laser 500 is shown in a perspective view. The QC laser 500 incorporates the QC laser structure 100 of FIG. 1 mounted to a heat sink 502 and coupled to a current source 510, in accordance with an embodiment of the present invention. The beat sink 502 may be a copper substrate, for example. To produce the output laser beam, electrical power from the current source 510 is converted to light in the core region 105, as described above. Carriers (e.g., electrons) are injected into the core region 105 from the current source 510, which decay to a lower energy state with light emission. This light propagates within the optical waveguide, which includes the core 105, in the longitudinal y-direction parallel to or approximately parallel to the axis 111, where it is amplified by the lasing action. This happens when a sufficient number of carriers are injected into the device through the contact metal electrodes 122 and at 109, which causes the cascaded active layers within the core region 105 to generate lasing. The selected Bragg diffraction provides cavity resonance feedback (for amplification) and the reflection of the selected laser wavelength to form the diverging counter-propagating traveling wave beams that produce the resonant oscillations, which are the foundation of the laser's operation. In other words, diffraction due to the grating couples light traveling in the +y direction into the −y direction and vice-versa, as described above. This produces the resonant oscillation lasing mode of the QC laser 500 in FIG. 5.

On each incident pass of a given traveling wave beam, the second order optical mode of the second order Bragg diffraction grating feeds the waveguide mode traveling in the direction opposite to the incident waveguide mode. The first order coupling of the second order Bragg diffraction grating couples the laser light within the resonance cavity into the surface normal direction for surface-emitted laser output, as discussed above. Light is diffracted into both vertical directions, +z and −z, and the light diffracted into the −z direction is reflected back into the +z direction to become part of an output beam 505. The output beam 505 constitutes both the beam that is coupled "upward" by the grating and the beam that is coupled "downward" by the grating and reflected by the top metal mirror 124 back through the grating, or reflected upward by the mirrored surface on the grating interface, according to the particular disclosed embodiment, as discussed above. In this manner, the grating facilitates coupling of the resonant oscillation lasing mode within the laser cavity into the surface-emitting mode. Thus, the laser cavity mode traveling wave beams interact with the grating to produce first and second order Bragg diffraction, resulting in a wide coherent surface-emitted output laser beam.

The output beam 505 is slightly astigmatic, and is projected through the top of the laser in the +z direction perpendicular or approximately perpendicular to the plane of the wide lasing region under the conducting stripe 122. This astigmatism is limited fundamentally by the uniformity and precision of the fabrication control and typically is far less severe than that of the output beam of an edge-emitting semiconductor laser.

In practice, the substrate 101 usually is thinned down to a thickness of approximately 70–150 μm after fabrication of a number of QC laser structures 100 in a given wafer, by some chemical or mechanical or combined chemical/mechanical method (e.g., grinding and polishing) for the ease of device cleavage. The absorption coefficient of the substrate material 101 at the lasing wavelength is usually very small (primarily due to free carrier absorption), so that optical loss within the substrate is not a major concern. However, if the optical loss in the substrate is not small, the substrate is can be thinned down even further to reduce the optical loss.

The substrate side metal contact, for example the metal stripes 122 in FIG. 5, is deposited on the sides of the substrate side surface 123 without substantially blocking the output laser light. Alternatively, a conducting film can be used as the electrical contact layer on the substrate side 123 to cover the whole area if it is transparent at the laser wavelength. An anti-reflection coating, having a reflectivity of less than 5% for example, is preferably deposited onto the surface 123 in FIG. 5, which will allow most of the output laser beam to pass through the surface 123 into free space. The reflectivity of the anti-reflection coating is preferably as small as possible, because any laser light reflected from the substrate surface 123 will be reflected back to the epitaxial side metal mirror or reflecting surface at the interface 124 and be reflected back again to the surface 123, which will give rise to phase coherence and noise problems similar to those mentioned previously. The light that is reflected back from the surface 123 will be coupled by the grating back into the laser resonance cavity, giving rise to phase coherence and noise problems.

As shown in FIG. 5, for example, the QC laser 100 is bonded to the heat sink 502 at the interface 124 with an electrically conducting material. A heat sink surface 511 of the heat sink 502 provides one of the electrodes for the QC laser 100 from the metal deposited at the layer 109 (or from the heat sink 502 itself if it is made of a conducting material) on the epitaxial side of the QC laser 100. The biasing current (or voltage) source 510 is shown connected to the two contacts or at the layer 124 and the stripe 122. The bias direction of the current source 42 depends on the design of the active region 105, which may biased from either direction, as indicated by the +(−) and −(+) symbols shown for the current source 510 in FIG. 5, because the QC laser 100 is a unipolar device. Electrical power provided by the current source 510 is converted to light by the lasing action in the active region 105.

In summary, the present invention features a high-power, spatially-coherent, single-mode, surface-emitting, unipolar QC laser, which can serve as a mid-IR laser source, and method for making the laser. The light propagates within the laser resonance cavity in the longitudinal y-direction of the coordinate system 117, and is amplified by the lasing action. Diffraction by a grating couples the light traveling in the +y direction into the light traveling in the −y direction and vice versa. This counter-propagating light also is diffracted by the grating into the +z direction and the −z direction, with the light traveling in the −z direction being reflected back toward the +z direction as part of the output laser beam, as described above. An unstable resonance cavity structure has a lens-like media structure to cause beam divergence of the counter-propagating light, which advantageously prevents filamentation effects that cause multimode lasing under high injection current. The combined effect of the grating and the unstable resonance cavity allows the laser to maintain a narrow spectral, single mode, and small diffraction output at high injection current. The output light emitted from the surface area 123 is slightly larger than the current confined stripe area, which is the area between the two regions 122 in FIGS. 1 and 5.

It will be understood that various changes in the details, materials, and arrangements of the parts which have been described and illustrated above in order to explain the nature of this invention may be made by those skilled in the art without departing from the principle and scope of the invention as recited in the following claims.

What is claimed is:

1. A unipolar surface emitting semiconductor laser having a wide lasing region for producing a spatially coherent output beam comprising:

a semiconductor resonance cavity for producing a laser mode of diverging counter-propagating traveling wave beams of light derived from unipolar inter-subband transitions within the wide lasing region of the semiconductor laser;

a diffraction grating for resonantly coupling the diverging counter-propagating traveling wave beams while also coupling a portion of the traveling wave beams into an output beam transverse to the wide lasing region; and a semiconductor layer for coacting with the traveling wave beams of the resonance cavity and having an effective index of refraction that varies quadratically in a direction transverse to the traveling wave beams of light with the lowest values thereof at centralized portions of the laser and higher values thereof at noncentralized portions of the laser.

2. The laser of claim 1, wherein the diffraction grating comprises a second order Bragg grating.

3. The laser of claim 1, further comprising a reflecting surface spaced from the grating such that a portion of the output beam that is reflected from the reflecting surface before being combined with other portions of the output beam remains in-phase with the other portions of the output beam.

4. The laser of claim 2, wherein the diffraction grating comprises a second Bragg order grating.

5. The laser of claim 1, wherein the semiconductor layer comprises a trough to provide the effective index of refraction variation.

6. A surface emitting semiconductor laser having longitudinal and lateral dimensions, and a transverse dimension perpendicular thereto, a wide active lasing region perpendicular to the transverse dimension for producing a spatially coherent output beam comprising:

a semiconductor resonance cavity producing a laser mode of diverging counter-propagating traveling wave beams of light derived from unipolar inter-subband transitions within an active region of the semiconductor laser and along a centralized axis parallel to the longitudinal dimension; and a diffraction grating for resonantly coupling the diverging counter-propagating traveling wave beams while also coupling a portion of the traveling wave beams into an output beam transverse to the centralized axis; and a semiconductor layer for coacting with the traveling wave beams and having an effective index of refraction that varies quadratically in a direction transverse to the centralized axis, with lowest values thereof at centralized portions proximate or on the centralized axis of the laser and higher values thereof at noncentralized portions of the laser.

7. The laser of claim 6, wherein the diffraction grating comprises a second order Bragg grating.

8. The laser of claim 6, wherein the semiconductor layer comprises a trough to provide the effective index of refraction variation.

9. The laser of claim 8, wherein the diffraction grating comprises a second order Bragg grating.

10. A unipolar surface emitting semiconductor laser having longitudinal and lateral dimensions, and a transverse dimension perpendicular thereto, and a wide active lasing region perpendicular to the transverse dimension for producing a spatially coherent output beam comprising:

a semiconductor resonance cavity for producing a laser mode of diverging counter-propagating traveling wave beams of light derived from unipolar inter-subband transitions within an active region of the semiconductor laser and along a centralized axis parallel to the longitudinal dimension;

a diffraction grating having grooves extending perpendicular to the longitudinal axis for resonantly coupling the diverging counter-propagating traveling wave beams while also coupling a portion of the traveling wave beams into an output beam perpendicular to the centralized axis; and a semiconductor layer for coacting with the traveling wave beams and having an effective index of refraction that varies quadratically in a direction perpendicular to the centralized axis, with the lowest value thereof at centralized portions of the laser and the higher values thereof at noncentralized portions of the laser proximate the centralized axis.

11. A unipolar semiconductor laser, comprising:

a multilayer semiconductor structure comprising:
        doped semiconductor material of only one conductivity type;
        a plurality of nominally identical active regions, each active region separated from an adjoining active region by a carrier injection/relaxation region, and comprising one or more quantum wells having a higher energy state and a lower energy state for carriers of the one conductivity type;
        the energy relaxation region selected to provide for energy relaxation of the carriers of the one conductivity type when a current source or electrical bias is coupled to the semiconductor laser, some of the carriers of the one conductivity type being introduced into the energy relaxation region from the active region;
        some of the carriers of the one conductivity type undergoing a radiative transition from the higher energy state to the lower energy state;
        a diffraction grating for providing feedback in a portion of the multilayered semiconductor structure to enhance the radiative transitions; and
        a reflecting surface disposed relative to the grating such that light directed in one direction by the grating and reflected from the reflecting surface that forms a portion of the output light from the laser is in phase with other light directed in a different direction by the grating that forms another portion of the output light.

12. The semiconductor laser of claim 11, wherein the one conductivity type material comprises n-type semiconductor material.

13. The semiconductor laser of claim 11, wherein the radiative transitions comprise inter-subband transitions.

14. The semiconductor laser of claim 11, wherein said energy relaxation region comprises a plurality of semiconductor layers forming a superlattice.

15. The semiconductor laser of claim 11, wherein the grating comprises a second order Bragg grating.

16. The semiconductor laser of claim 11, wherein the carriers of the one conductivity type comprise electrons.

17. The semiconductor laser of claim 11, wherein the multilayer semiconductor structure is selected to provide a waveguide for photons of energy corresponding to the radiative transition between the higher and the lower energy states.

18. The semiconductor laser of claim 11, wherein the multilayer semiconductor structure comprises a waveguide core and claddings, the core comprising the active regions, wherein a refractive index of the core is higher than another refractive index of the claddings.

19. The semiconductor laser of claim 11, wherein each of the active regions comprises Group III–V semiconductor materials.

20. The semiconductor laser of claim 11, wherein the grating, in providing feedback, couples counter-propagating traveling wave beams in the multilayer semiconductor structure.

21. The semiconductor laser of claim 11, further comprising a lens-like media structure and a resonance cavity within the multilayer semiconductor structure, the lens-like media providing a refractive index variation within the multilayer semiconductor structure that discriminates in favor of one type of resonance mode of the resonance cavity.

22. The semiconductor laser of claim 11, wherein the multilayer semiconductor structure is constructed as a quantum cascade (QC) laser.

23. A quantum cascade (QC) semiconductor laser comprising a core region including a QC active region comprising a plurality of unipolar radiative transition regions interleaved with unipolar injection/relaxation regions;
  upper and lower cladding regions bounding the core region;
  the core region and the cladding regions comprising an optical waveguide;
  a diffraction grating adapted to couple light within the optical waveguide as output light;
  a reflecting surface spaced from the grating by an optical path such that light coupled from the waveguide to the reflecting surface has substantially the same phase upon return to the grating as light coupled from the waveguide by the grating but not reflected from the reflecting surface.

24. The laser of claim 23, wherein the core and the cladding regions comprise Group III–V semiconductor materials.

25. The laser of claim 23, wherein the grating comprises a second order Bragg grating.

26. The laser of claim 23, wherein the core and the cladding regions comprise Group III–V semiconductor material selected from InP, InGaAs, and InAlAs.

27. The laser of claim 23, wherein the upper cladding region comprises Group III–V semiconductor material selected from InP, and InAlGaAs, and the lower cladding region comprises Group III–V semiconductor material selected from InAlGaAs, InGaAsP, InAlAsP, and InP.

28. The laser of claim 23, wherein the upper cladding region comprises a plurality of InP layers.

29. The laser of claim 23, wherein the lower cladding region comprises an InP substrate.

30. A quantum cascade (QC) laser comprising:
  a substrate;
  core and cladding regions grown on the substrate;
  a QC active region disposed within the core region;
  a grating disposed within one of the cladding regions to couple light propagating within the laser to output light; and
  a reflecting surface spaced from the grating such that light diffracted by the grating and reflected from the reflecting surface is combined substantially in-phase with other light just diffracting from the grating and not reflecting from the reflecting surface as the output light.

31. The laser of claim 30, wherein the cladding regions comprise layers selected from InAlAs and InGaAs.

32. The laser of claim 30, wherein the cladding regions comprises InP.

33. The laser of claim 30, wherein the active region comprises a plurality of InAlAs/InGaAs layers.

34. A surface emitting unipolar quantum cascade semiconductor laser for producing a spatially coherent single-mode laser output beam substantially perpendicular to a semiconductor substrate surface of the laser, the laser comprising:
  a multilayer semiconductor structure having doped semiconductor material of only one conductivity type;
  the multilayer semiconductor structure comprising:
    a core region of larger effective refractive index between cladding regions of smaller effective refractive index, the core region having a plurality of repeat units, each repeat unit having a nominally identical active region and a carrier injection and relaxation region, wherein the plurality of repeat units are for quantum cascade generation of a lasing resonance mode within a lasing resonance cavity defined by the multilayer semiconductor structure,
    a diffraction grating structure for resonantly coupling diverging counter-propagating traveling wave beams of the laser resonance mode together while diffracting light into an upward direction perpendicular to a grating plane of the grating structure and toward the substrate surface, and diffracting other light into a downward direction opposite said upward direction,
    a reflecting surface for reflecting the downward coupled laser light in the upward direction, wherein the distance of the reflecting mirror from the grating structure is selected to cause the phase of the reflected light to match that of the upward coupled laser light so that the reflected light and the upward coupled laser light combine to form the output beam, and
    a variable index of refraction semiconductor layer structure having a variable effective refractive index profile in a direction transverse to the laser resonance cavity and parallel to the semiconductor substrate surface, the lowest value of the effective refractive index profile being located at a centralized portion of the laser and having an increasing value when moving away from the centralized portion to form a lens-like media for interacting with, the counter-propagating wave beams to discriminate in favor of one resonance mode over other resonance modes.

35. The semiconductor laser of claim 34, wherein the one resonance mode is favored over the other resonance modes by enhancement of light divergence.

36. The semiconductor laser of claim 34, wherein the grating structure is spaced from the core region such that electromagnetic radiation in a confined laser mode has non-zero intensity at the grating structure.

37. The semiconductor laser of claim 34, wherein the active region comprises a layered structure selected to provide upper and lower confined unipolar carrier energy states such that a carrier transition from the upper to the lower energy state results in emission of a photon, the carrier injection region comprising a layered structure selected to facilitate carrier transport from the lower energy state of the active region of a given repeat unit to the upper energy state of the active region of an adjacent repeat unit.

38. The semiconductor laser of claim 34, wherein the grating structure comprises a grating of constant periodicity.

39. The semiconductor laser of claim 34, wherein the grating structure is disposed such that a coupling constant of the grating structure is a complex coupling constant.

40. The semiconductor laser of claim 34, wherein the grating structure is disposed such that a coupling constant of the grating structure is an index dominated coupling constant.

41. The semiconductor laser of claim 34, wherein the grating profile comprises any reasonable periodic shape, such as sinusoidal, round, triangular or trapezoidal.

42. The semiconductor laser of claim 34, wherein the grating structure comprises a second order Bragg grating.

43. The semiconductor laser of claim 34, wherein the multilayer semiconductor structure produces a variable effective refractive index by use of a trough profile formed therein.

44. The semiconductor laser of claim 43, wherein the trough profile comprises either a "dip" profile or a "bump" profile.

45. The semiconductor laser of claim 34, further comprising electrical contacts selected to facilitate flow of an electric current through the laser.

46. The semiconductor laser of claim 45, wherein the grating structure is either disposed between the core region and an upper one of the electrical contacts or between the core region and the semiconductor substrate.

47. The semiconductor laser of claim 46, wherein the variable index of refraction semiconductor layer structure is disposed either between the core region and an upper one of the electrical contacts or between the core region and the semiconductor substrate.

* * * * *